United States Patent [19]

Michii et al.

[11] Patent Number: 5,373,188
[45] Date of Patent: Dec. 13, 1994

[54] PACKAGED SEMICONDUCTOR DEVICE INCLUDING MULTIPLE SEMICONDUCTOR CHIPS AND CROSS-OVER LEAD

[75] Inventors: Kazunari Michii; Koichi Nakagawa, both of Itami, Japan

[73] Assignee: Mitsubishi Denki Kabushiki Kaisha, Tokyo, Japan

[21] Appl. No.: 3,422

[22] Filed: Jan. 12, 1993

[30] Foreign Application Priority Data

Nov. 4, 1992 [JP] Japan .................. 4-295134

[51] Int. Cl.⁵ .................. H01L 23/48; H01L 29/44; H01L 29/52; H01L 29/60
[52] U.S. Cl. .................. 257/666; 257/776; 257/773
[58] Field of Search .............. 257/666, 668, 776, 773, 257/692

[56] References Cited

U.S. PATENT DOCUMENTS

| 4,246,595 | 1/1981 | Noyori et al. ............ 257/668 |
| 4,257,061 | 3/1981 | Chapel et al. ............ 257/668 |
| 4,721,995 | 1/1988 | Tanizawa ................. 257/668 |
| 4,783,695 | 11/1988 | Eichelberger et al. ........ 257/668 |
| 4,884,122 | 11/1989 | Eichelberger et al. ........ 257/668 |
| 4,903,114 | 2/1990 | Aoki et al. ............... 357/70 |
| 4,937,656 | 6/1990 | Kohara .................. 357/70 |
| 5,021,866 | 6/1991 | Sudo et al. .............. 357/70 |
| 5,126,821 | 6/1992 | Okinaga et al. ........... 357/70 |
| 5,220,196 | 6/1993 | Michii et al. ............ 257/787 |
| 5,245,215 | 9/1993 | Sawaya .................. 257/723 |
| 5,245,216 | 9/1993 | Sako .................... 257/723 |

FOREIGN PATENT DOCUMENTS

| 0503201 | 12/1991 | European Pat. Off. . |
| 0498446 | 2/1992 | European Pat. Off. . |
| 0498446A2 | 8/1992 | European Pat. Off. . |
| 61-218139 | 9/1986 | Japan . |
| 63-255953 | 10/1988 | Japan . |
| 4144142 | 5/1992 | Japan . |

*Primary Examiner*—Andrew J. James
*Assistant Examiner*—S. V. Clark
*Attorney, Agent, or Firm*—Leydig, Voit & Mayer

[57] ABSTRACT

A resin-molded multi-chip package semiconductor device includes a lead frame having a plurality of leads including crossing leads that extend over an obverse or a reverse side of one semiconductor element separated from electrical contact with the element by an interposed insulating material. The electrodes of one element and of another element are electrically connected in common to the crossing lead by bonding wires. The device may comprise a TAB tape having leads on an insulating tape, electrically connecting the electrodes of the neighboring elements together. The TAB tape may include crossing leads that cross another TAB lead.

14 Claims, 10 Drawing Sheets

PACKAGED SEMICONDUCTOR DEVICE INCLUDING MULTIPLE SEMICONDUCTOR CHIPS AND CROSS-OVER LEAD

BACKGROUND OF THE INVENTION

This invention relates to a multi-chip package (MCP) semiconductor device wherein a plurality of semiconductor elements are encapsulated within a single body of resin.

While it is desired to make semiconductor device of one chip in order to make an electronic system employing such a semiconductor device high in packaging density and speed, it takes a prolonged term for designing, developing and delivering new semiconductor devices. Also, many problems concerning the electrical characteristics and wafer processing must be solved in order to realize a combination of an analogue circuit and a digital circuit. Therefore, instead of the system on chip arrangement, a semiconductor device of the multi-chip package (MCP) type in which a plurality of presently available semiconductor chips are encapsulated within a single package is being increasingly used.

One example of the conventional MCP-type semiconductor device includes a ceramic substrate or a printed circuit board on which a plurality of semiconductor chips are mounted and which is transfer molded together with a lead frame. However, since this arrangement utilizes a ceramic substrate or a printed circuit board both of which are expensive, the overall device is expensive.

Figure 14:
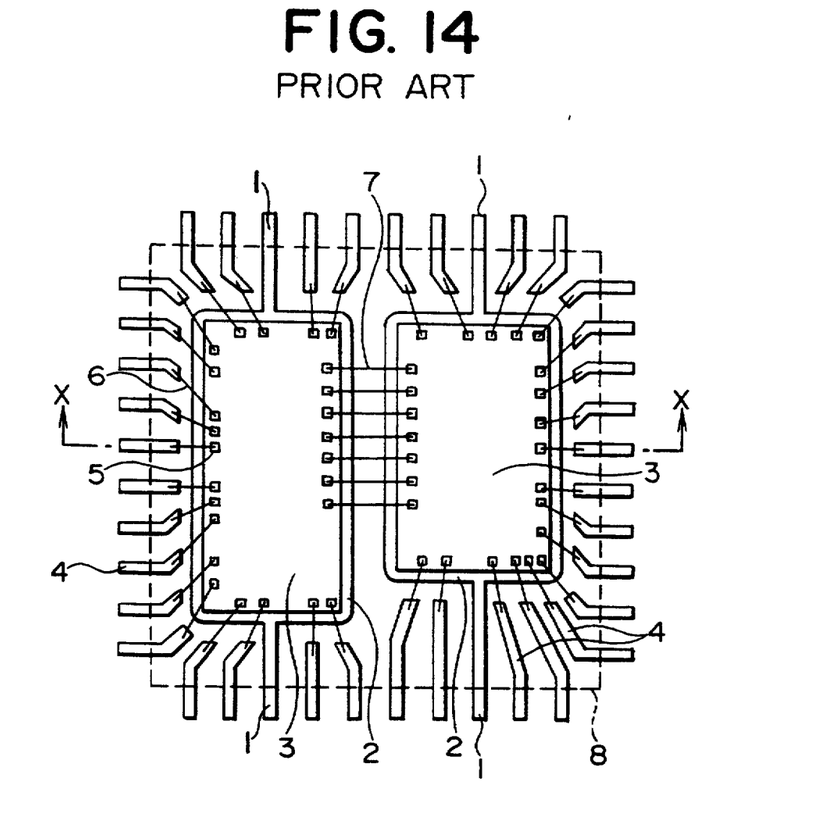
FIG. 14 is a schematic plan view of a conventional MCP semiconductor device.
Figure 15:
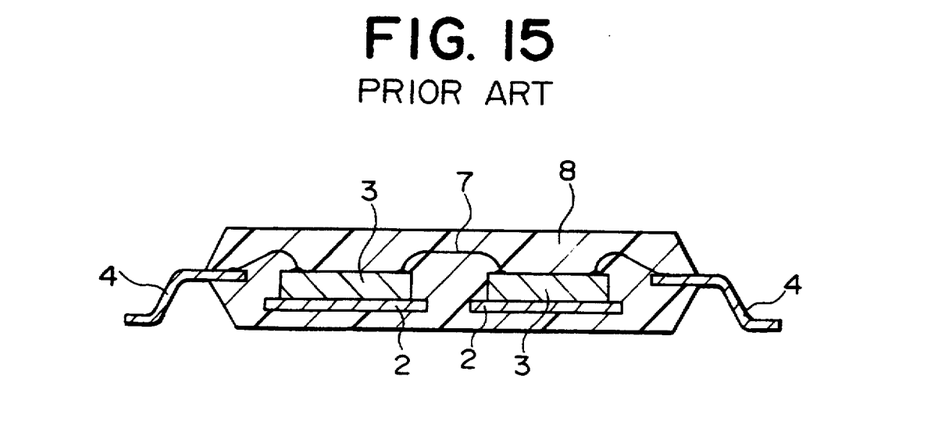
FIG. 15 is a schematic sectional view taken along line X—X of FIG. 14.
Figure 16:
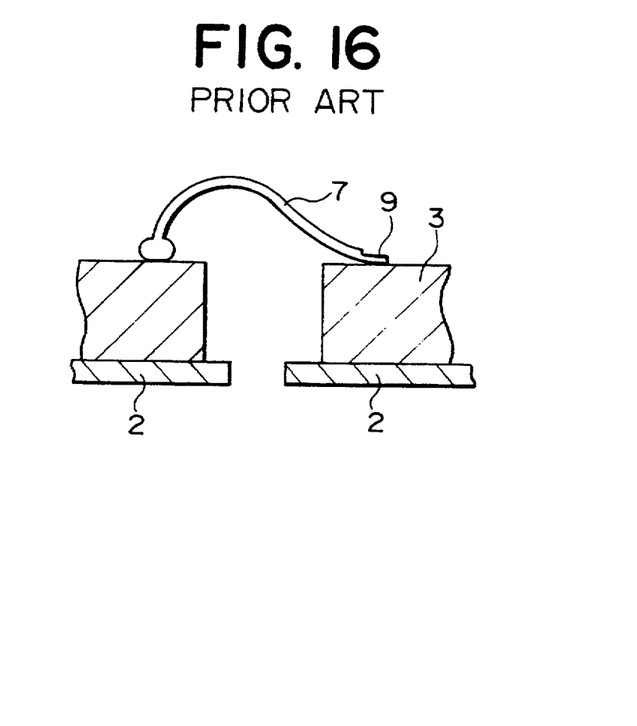
FIG. 16 is a partial, enlarged view of FIG. 15.

In another conventional MCP-type semiconductor device, a plurality of semiconductor elements are directly mounted to a lead frame as illustrated in FIGS. 14 and 15. That is, in these figures, the semiconductor device comprises semiconductor elements 3 respectively mounted on two substantially rectangular die-pads 2 each having two supporting leads 1. The die-pads 2 are arranged in a side-by-side relationship to each other and a number of leads 4 are disposed around the die-pads 2 so that their inner ends may be connected by bonding wires 6 to the electrodes 5 on the semiconductor elements 3. As illustrated in FIG. 16, the electrodes 5 on the neighboring sides of the semiconductor elements 3 are electrically connected together by bonding wires 7, whereby the number of the leads 4 is reduced and the package substrates may be simplified. The whole assembly thus prepared is encapsulated within a single resin 8 except for outer portion of the leads 4.

In the conventional MCP semiconductor device as above described, the leads 4 can be freely arranged only at around the periphery of the die-pads 2, so that the electrical connection between the electrodes 5 on the semiconductor elements 3 and the leads 4 cannot be freely arranged, requiring the number and the length of the leads 4 to be increased, the overall dimensions of the MCP semiconductor device to be increased and the lead inductance to become high.

Also, since the electrodes 5 on two different semiconductor elements 3 are connected together by bonding wires 7 as illustrated in FIG. 16, which causes the semiconductor element 3 to receive a large mechanical stress through the electrode 5 on the stitch bond side 9 of the bonding wire 7 at which the bonding wire 7 is firmly pressed against the element 3 and severed, the reliability of the semiconductor element 5 is decreased. Also, the only electrodes 5 that can be connected together by the bonding wires 7 are those on the neighboring sides of two semiconductor elements 3.

SUMMARY OF THE INVENTION

Accordingly, one object of the present invention is to provide a multi-chip package semiconductor device free from the above discussed problems of the conventional MCP semiconductor device.

Another object of the present invention ms to provide a multi-chip package semiconductor device in which the leads can be freely arranged to have an improved degree of freedom.

Still another object of the present invention is to provide a multi-chip package semiconductor device in which the interconnections between the semiconductor elements and the semiconductor elements themselves have improved reliability.

With the above objects in view, the multi-chip package semiconductor device of the present invention comprises a plurality of semiconductor elements each having a first and a second major surface and a number of inner electrodes disposed on the first major surface. The semiconductor elements are mounted on a lead frame having a plurality of leads including a cross-over lead, the cross-over lead extending from one side to the other side of at least one of the semiconductor elements beyond their side edges without electrically contacting the major surfaces of the semiconductor element. Bonding wires are connected between the electrodes on the semiconductor elements and the leads of the lead frame for electrically connecting them together, and a mold resin has encapsulated in it the semiconductor elements, portions of the leads and the bonding wires.

The semiconductor element may be attached at its first or second major surface to an electrically insulating material which is attached to the cross-over lead, and at least one of the inner electrodes of the at least one semiconductor element and at least one of the inner electrodes of another semiconductor element may be electrically connected in common to the cross-over lead by bonding wires.

Alternatively, the lead frame may include a die-pad and another of the plurality of semiconductor elements is mounted on the die-pad, and the at least one semiconductor element may be attached at its second major surface to an electrically insulating material which is attached to the cross-over lead, and at least one of the inner electrodes the at least one semiconductor element and at least one of the inner electrodes of the another semiconductor element may be electrically connected in common to the cross-over lead by a bonding wire. The cross-over lead may extend through the semiconductor device and the inner electrodes on the semiconductor elements are electrically connected to the cross-over lead.

The multi-chip package semiconductor device of the present invention may comprise a TAB tape having a plurality of electrically conductive TAB leads on an electrically insulating tape with the TAB leads solder-bonded to the inner electrodes of neighboring semiconductor elements electrically connecting them together. The TAB leads may be formed on only one side of the insulating tape or, alternatively, the TAB leads may include opposite end portions on the same side of the insulating tape, a central portion on the other side of the insulating tape and bridge portions electrically connecting the end portions and the central portion.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Figure 1:
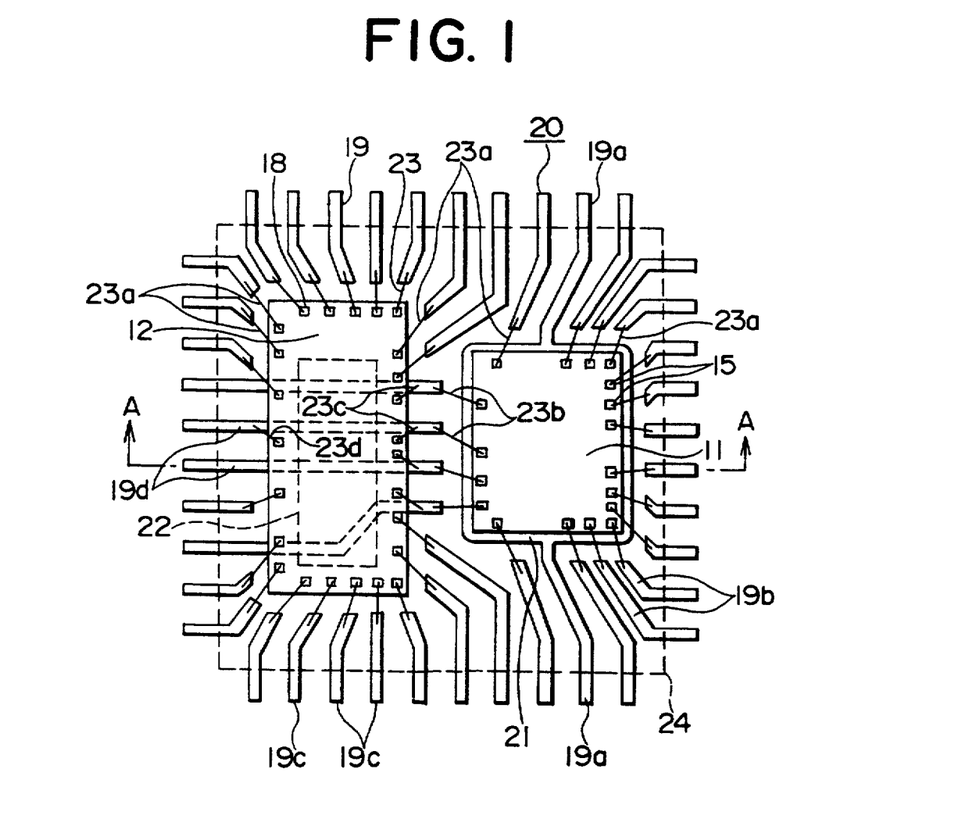
FIG. 1 is a schematic plan view of the MCP semiconductor device according to the present invention.
Figure 2:
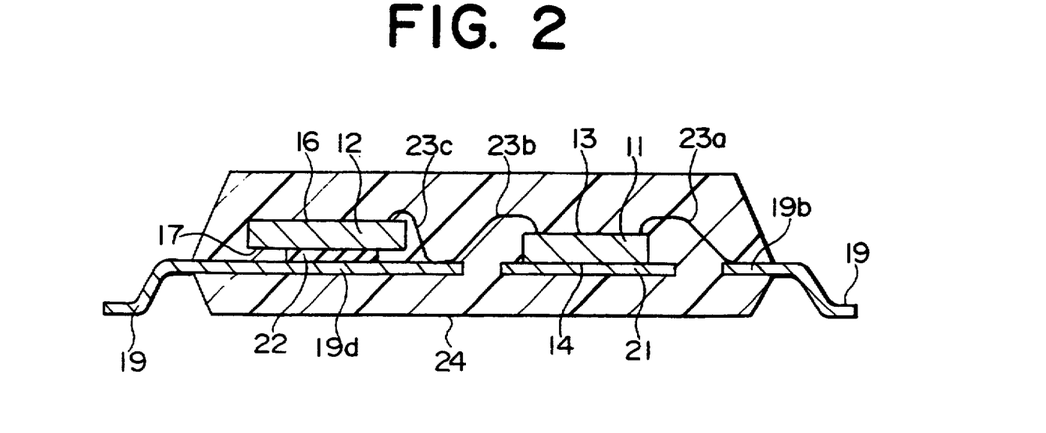
FIG. 2 is a schematic sectional view taken along line A—A of FIG. 1.

FIGS. 1 and 2 illustrate a multi-chip package (MCP) semiconductor device of the present invention, FIG. 1 being a plan view and FIG. 2 being a sectional side view taken along line A—A of FIG. 1. The MCP semiconductor device of the present invention comprises a first semiconductor element 11 and a second semiconductor element 12. The first semiconductor element 11 has a first major surface 13 and a second major surface 14 (see FIG. 2) of substantially rectangular configuration to the first major surface 13 has along an edge thereof a number of inner electrodes 15. The second semiconductor element 12 has a first major surface 16 and a second major surface 17 (see FIG. 2) of substantially rectangular configuration the first major surface 16 has along an edge thereof a number of inner electrodes 18.

The MCP semiconductor device of the present invention also comprises a lead frame 20 having a plurality of leads 19 and for mounting the semiconductor elements 11 and 12 thereon in a side-by-side relationship. The lead frame 20 comprises a die-pad 21 for mounting the first semiconductor element 11 thereon, first leads 19a extending outwardly from the die-pad 21, second leads 19b spaced apart from the diepad 21 but extending outwardly from the position in the vicinity of the side edge of the die-pad 21, third leads 19c surrounding a semiconductor element mounting portion in which the second semiconductor element 12 is mounted and extending outwardly from the position in the vicinity of the side edge of the second semiconductor element 12 and fourth leads 19d extending outwardly from the position in the vicinity of the side edge of the die-pad 21 passing below the semiconductor element mounting portion for the second semiconductor element 12. The fourth leads 19d have disposed thereon a suitable electrically insulating layer 22 for electrically insulating the second semiconductor element 12 secured thereon from the fourth leads 19d. In other words, some of the leads 19, i.e., the fourth leads 19d extend from one side (the right side in FIG. 1) of the second semiconductor element 12 to the other side (the left side in FIG. 1) thereof without electrically contacting either of the first major surface 16 or the second major surface 17 of the second semiconductor element 12. In this sense, the fourth leads 19d are cross-over leads.

The MCP semiconductor device of the present invention further comprises bonding wires 23 electrically connecting the inner electrodes 15 and 18 on the first and the second semiconductor elements 11 and 12 to the leads 19 of the lead frame 20, and a resin 24 having encapsulated therein the semiconductor elements 11 and 12, portions of the leads 19 corresponding to inner lead portions and the bonding wires 23 is apparent from FIG. 1, most of the bonding wires 23 are first bonding wires 23a extending from the inner electrodes or 18 to the inner ends of the second or the third leads 19b or 19c, but other the bonding wires 23 are second bonding wires 23b extending from the inner electrodes 15 on the left (as seen in FIG. 1) side edge portion of the first semiconductor element 11 to the inner ends of the fourth leads 19d, third bonding wires 23c extending from the inner electrodes 18 on the right hand side edge of the second semiconductor element 12 to the inner ends of the same fourth leads 19d. Thus, the second to the fourth bonding wires 23b, 23c and 23d out, of the bonding wires 23 connected to the inner electrodes 15 and 18 of the semiconductor elements 11 and 12, are connected in common to the fourth leads 19d and, in this sense, the fourth leads 19d are common leads through which the inner electrodes 15 and 18 on the neighboring side edge portions of the semiconductor elements are electrically connected to each other. The entire unit thus arranged is sealed with the resin 24, except for the outer end portions of the leads 19, providing a completed MCP semiconductor device.

According to the MCP semiconductor device of the present invention, some of the leads are cross-over leads which extend from one side to the other side of at least one of the semiconductor elements without electrically contacting the major surfaces of the semiconductor element to i.e., cross over the semiconductor element, so that the degree of freedom of lead arrangement and the pin connection can be very much improved. Also, since some of the inner electrodes of the plurality of semiconductor elements are connected to the common leads through the bonding wires, thus connecting the inner electrodes on the semiconductor elements together through the common leads, so that the reliability of the interconnections between the inner electrodes and the semiconductor elements themselves are improved and that the inner electrodes on the non-neighboring side edge portions of the semiconductor elements can be interconnected, improving the degree of freedom in lead arrangement.

Figure 3:
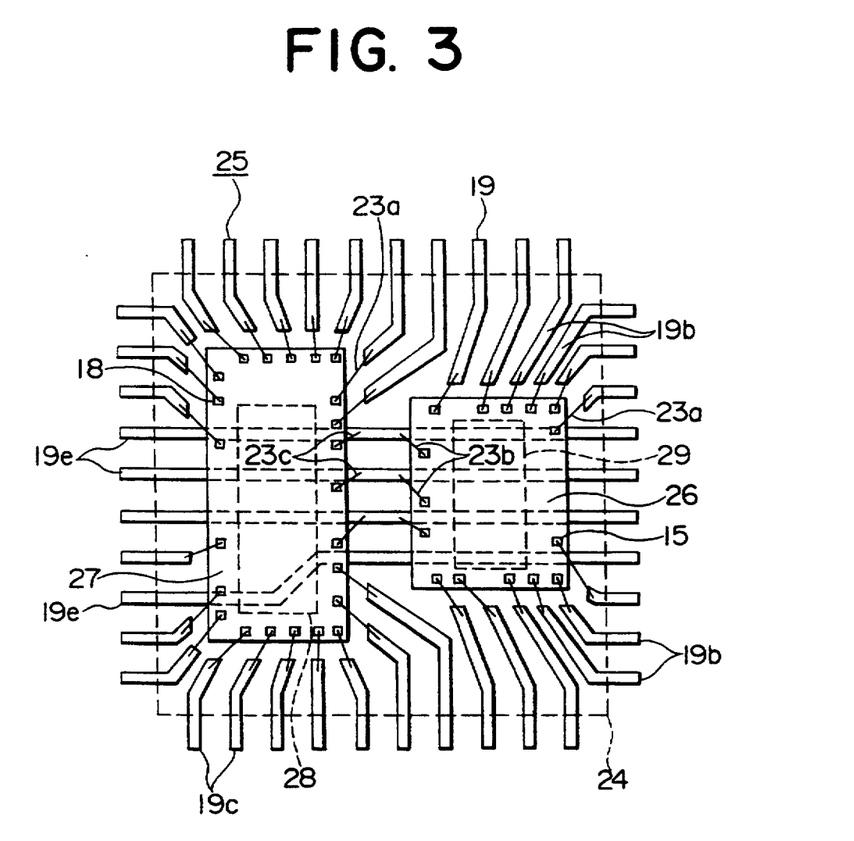
FIG. 3 is a schematic plan view of a second embodiment of the MCP semiconductor device of the present invention.

FIG. 3 illustrates another embodiment of the MCP semiconductor device of the present invention, in which a lead frame 25 has no die-pad and first and second semiconductor elements 26 and 27 are mounted on common cross-over leads 19e which extend transversely in FIG. 3 isolated from the semiconductor device by electrically insulating layers 28 and 29. This arrangement provides similar advantageous results similar to those of the first embodiment.

Figure 4:
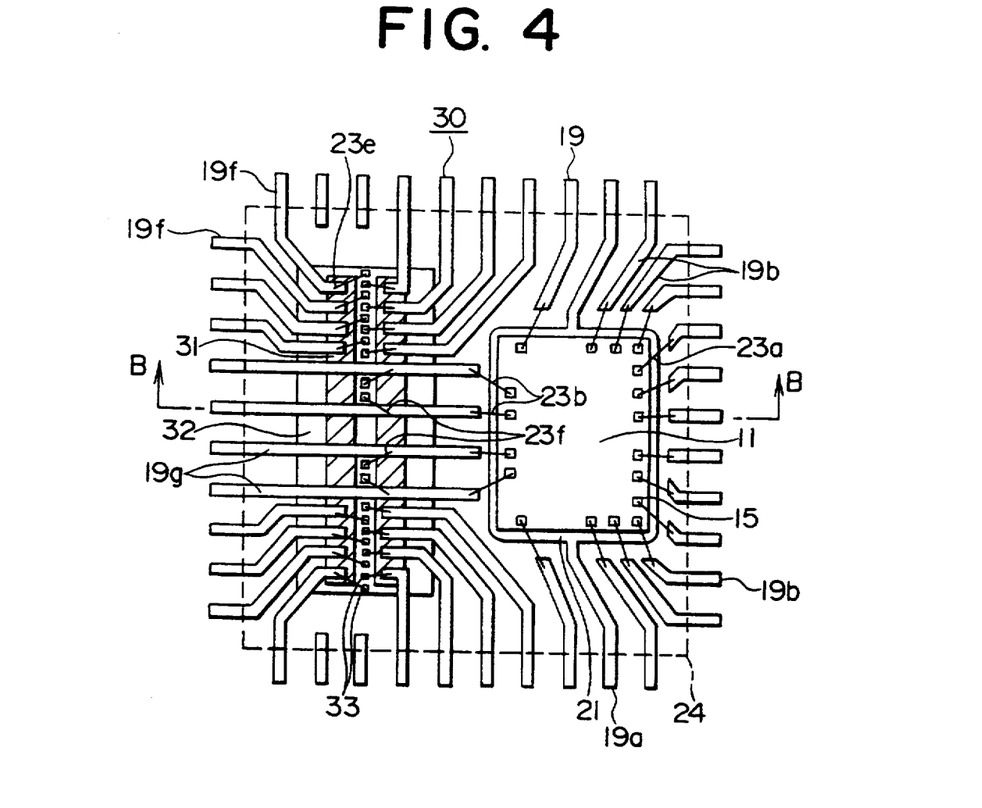
FIG. 4 is a schematic plan view of a third embodiment of the MCP semiconductor device of the present invention.
Figure 5:
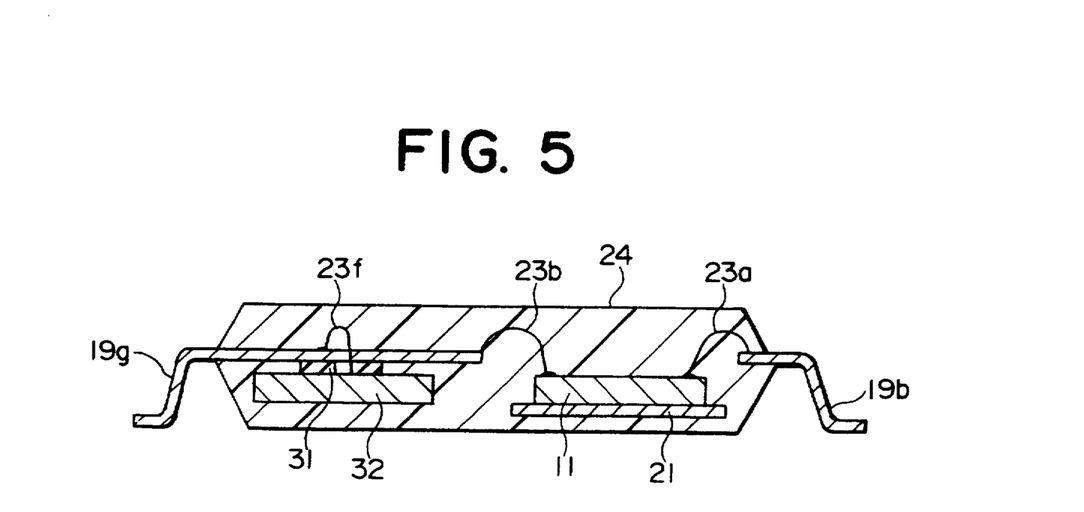
FIG. 5 is a schematic sectional view taken along line B—B of FIG. 4.

FIGS. 4 and 5 illustrate another embodiment of the MCP semiconductor device of the present invention in which a lead frame 30 comprises the die-pad 21, on which the first semiconductor element 11 is mounted, and the second semiconductor element 32 is mounted on leads 19f and 19g through an electrically insulating layer 31 on the first major surface 17 on which inner electrodes 33 are located facing toward the leads 19f and 19g, as a chip-on-lead type semiconductor device. The leads 19f have their inner ends oppositely arranged through the insulating layer 31 with respect to the first major surface 16 of the second semiconductor element 32, and the leads 19g extend across the first major surface 16 of the second semiconductor element 32. The inner electrodes 33 of the second semiconductor 32 are connected to the leads 19f and 19g through the bonding wires, 23e and 23f, respectively. In this embodiment also, advantageous results to those of the first embodiment can be obtained.

Figure 6:
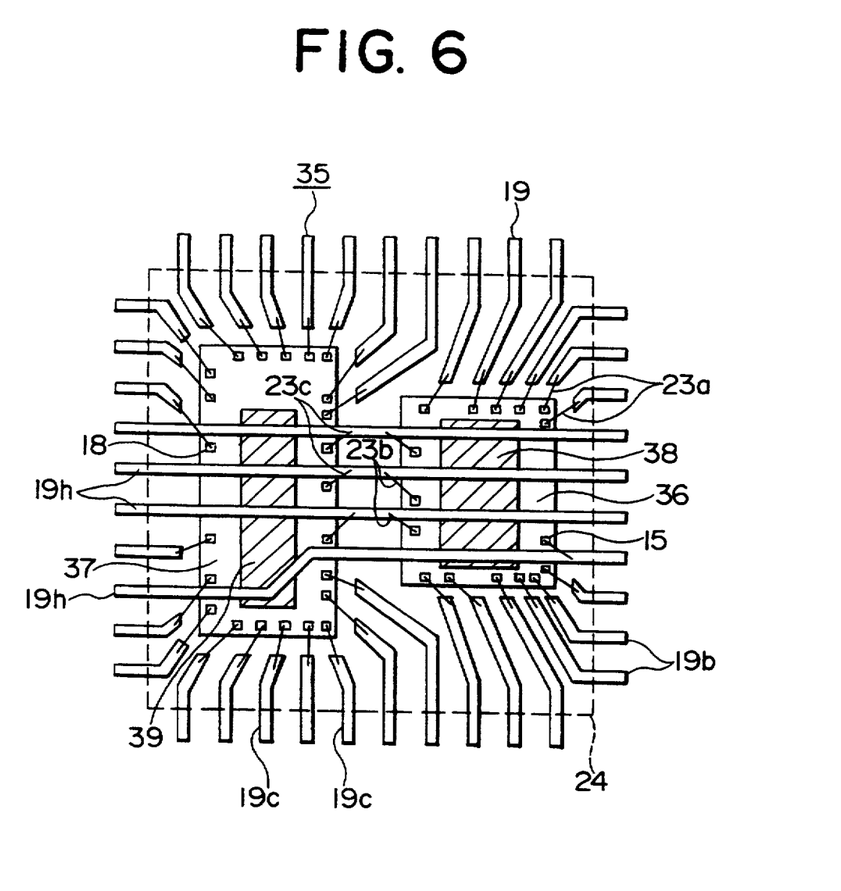
FIG. 6 is a schematic plan view of a fourth embodiment of the MCP semiconductor device of the present invention.

FIG. 6 illustrates still another embodiment of the MCP semiconductor device of the present invention, in which the device comprises a lead frame 35 having penetrating leads 19h extending across the MCP semiconductor device from one side to the other, and both of the first semiconductor element 36 and the second semiconductor element 37 are arranged so that their first major surfaces oppose the penetrating leads 19h through insulating layers 38 and 39. Also in this embodiment, advantageous results similar to those of the first embodiment can be obtained.

Figure 7:
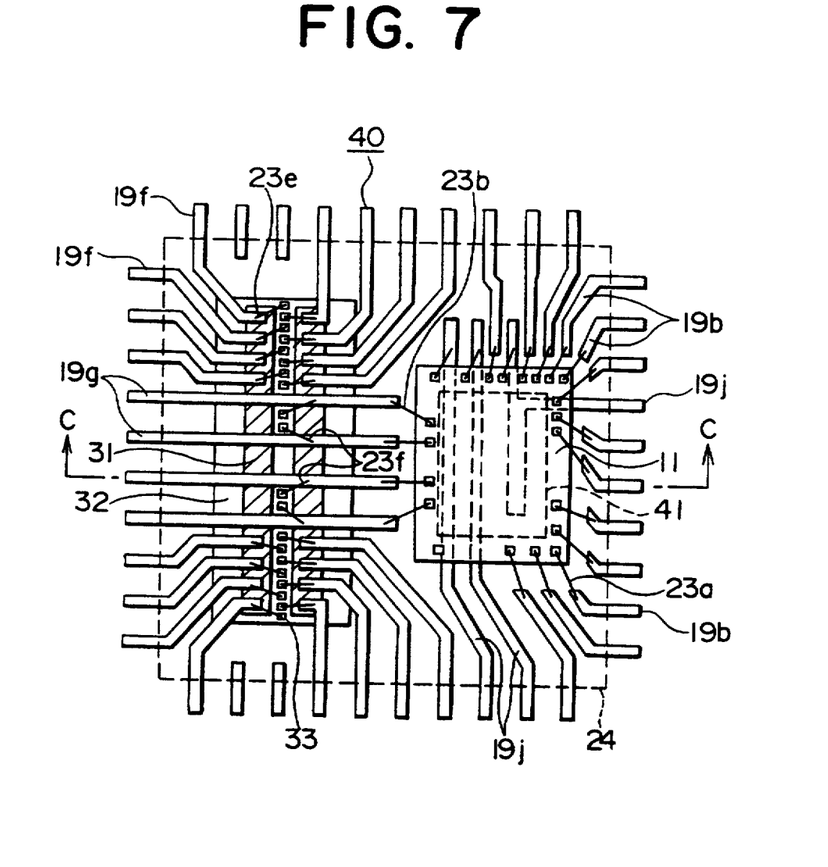
FIG. 7 is a schematic plan view of a fifth embodiment of the MCP semiconductor device of the present invention.
Figure 8:
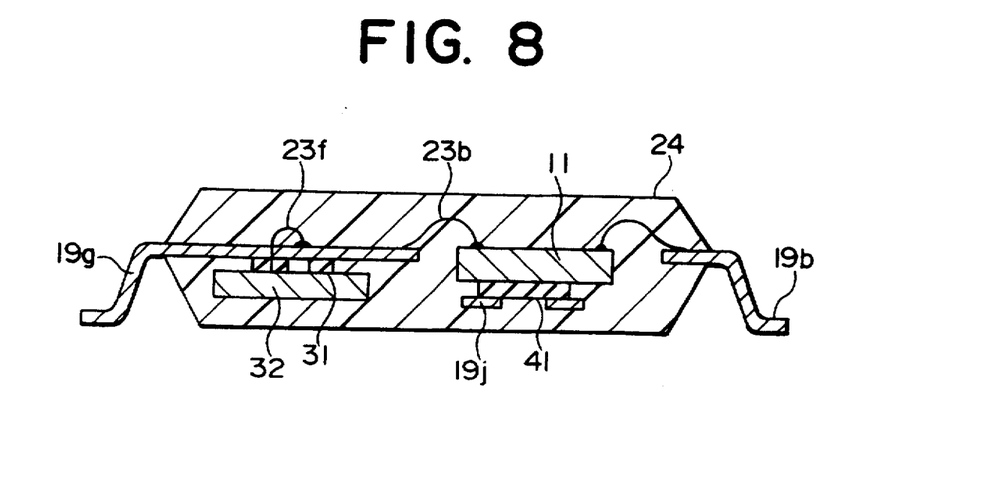
FIG. 8 is a schematic sectional view taken along line C—C of FIG. 7.

FIGS. 7 and 8 illustrate a further embodiment of the present invention, in which a MCP semiconductor device comprises a lead frame 40 which does not have a die-pad, the first semiconductor element 11 is attached at its second major surface 14 to leads 19j through an electrically insulating layer 41 and in which the second semiconductor element 32 is, as in the arrangement illustrated in FIG. 4, a chip-on-lead type apparatus with respect to the leads 19f and 19g. The leads 19f have their inner ends oppositely arranged through the insulating layer 31 with respect to the first major surface 16 of the second semiconductor element 32, and the leads 19g extend across the first major surface 16 of the second semiconductor element 32. The inner electrodes 33 of the second semiconductor 32 are connected to the leads 19f and 19g through the bonding wires, 23e and 23f, respectively. In this embodiment also, advantageous results similar to those of the first embodiment can be obtained.

Figure 9:
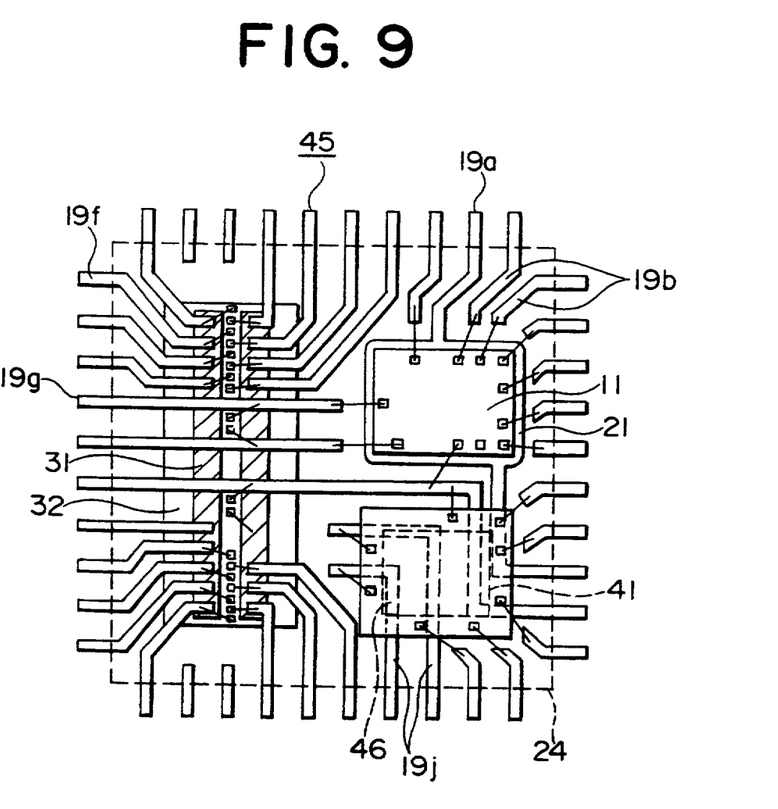
FIG. 9 is a schematic plan view of a sixth embodiment of the MCP semiconductor device of the present invention.

In another embodiment of the MCP semiconductor device of the present invention illustrated in FIG. 9, an additional semiconductor element mounted on a die-pad as shown in FIG. 1 is provided in the arrangement illustrated in FIGS. 7 and 8. That is, the MCP semiconductor device comprises a lead frame 45 including the die-pad 21, the first semiconductor element 11 is mounted on the die-pad 21 as a die-pad-mounted device, the second semiconductor element 46 is mounted at its second major surface to the lead frame 45 with an insulating layer 41 interposed therebetween as a chip-on-lead device, and the third semiconductor element 32 is mounted at its first major surface on the lead frame 45 through the insulating layer 31 is a lead-on-chip device.

Figure 10:
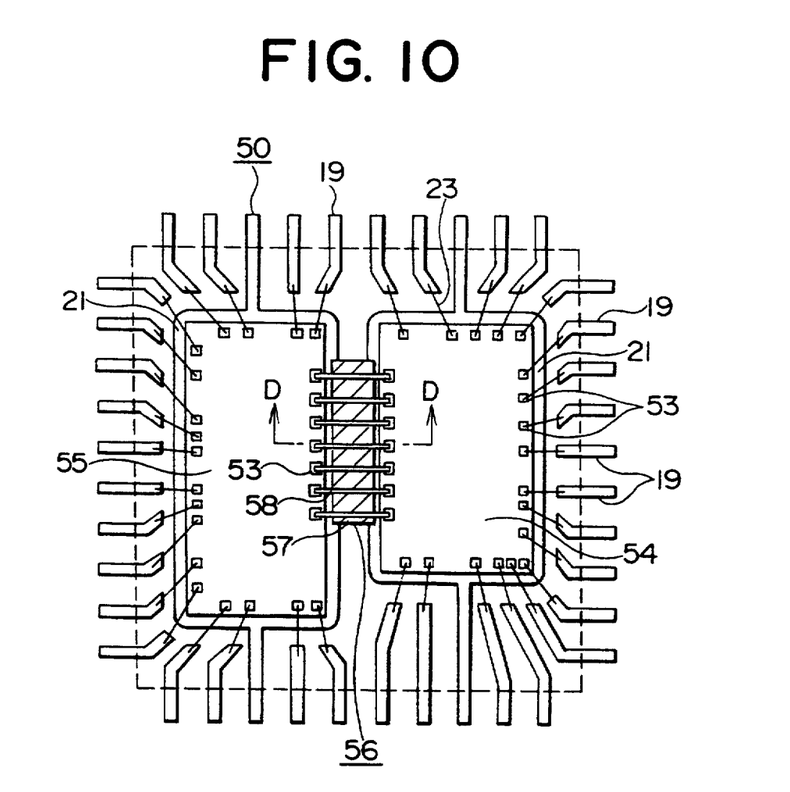
FIG. 10 is a schematic plan view of a seventh embodiment of the MCP semiconductor device of the present invention.
Figure 11:
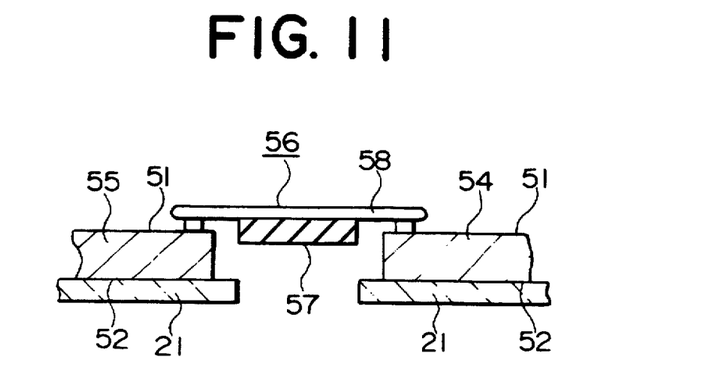
FIG. 11 is a schematic plane view taken along line D—D of FIG. 10.

FIGS. 10 and 11 illustrate another MCP semiconductor device of the present invention, which comprises a lead frame 50 including the plurality of leads 19 and two die-pads 21, and a substantially rectangular first semiconductor element 54 and a substantially rectangular second semiconductor element 55 each mounted on the respective die-pads 21, having a first major surface 51 and a second major surface 52 (FIG. 11) and having a plurality of inner electrodes 53 on the first major surface 51. The inner electrodes 53 on the first and the second semiconductor elements 54 and 55 are electrically connected to the leads 19 of the lead frame 50 through the bonding wires 23. Two semiconductor elements 54 and 55 are disposed in a side-by-side relationship with their side edges parallel and close to each other and the inner electrodes 53 on the neighboring side edges are electrically interconnected through a TAB tape 56. More particularly, the opposite ends of the TAB leads 58 on an electrically insulating tape 57, of polyimide, for example are placed on the inner electrodes 53 on the neighboring side edges of the two semiconductor elements 54 and 55 and they are directly bonded by TAB bonding, so that the semiconductor element is subjected to less mechanical stress, and are as compared to the connections by the wire bonding, and are free from mechanical damage. The MCP semiconductor device further comprises a resin 24 which seals and encapsulates the semiconductor elements 54 and 55, the portions of the leads 19 that correspond to the inner leads, the TAB tape 56 and the bonding wires 23.

Figure 12:
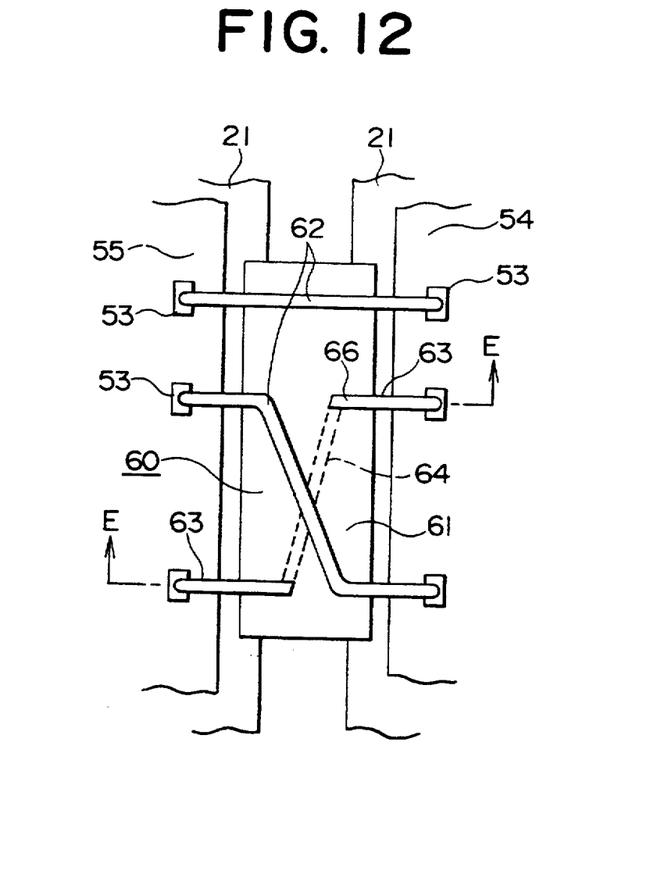
FIG. 12 is a schematic plan view of an eighth embodiment of the MCP semiconductor device of the present invention.
Figure 13:
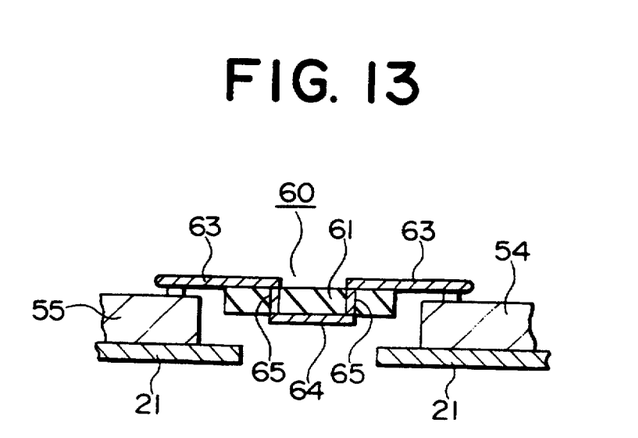
FIG. 13 is a schematic sectional view taken along line E—E of FIG. 12.

FIGS. 12 and 13 illustrates another MCP semiconductor device of the present invention which has a structure similar to that of the embodiment illustrated in FIGS. 10 and 12 except that the TAB tape used is a TAB tape 60 which is metallized at both surfaces. More particularly, the TAB tape 60 comprises an electrically insulating tape 61, TAB leads 62 formed on only one surface of the insulating tape 61 and a cross-over TAB lead 66 including opposite end portions 63 formed on one surface of the insulating tape 61, a central portion 64 on the other surface of the insulating tape 61 and two penetrating connecting portions 65 connecting the opposite end portions 63 and the central portion 64, whereby the cross-over TAB lead 66 is arranged to cross the TAB lead 62. In this embodiment, the cross-over wiring can be realized within the TAB tape 60, so that the degree of freedom of the pin connections is further increased.

As has been described, according to the MCP semiconductor device of the present invention, some of the leads are cross-over leads which extend from one side to the other side of at least one of the semiconductor elements without electrically contacting the major surfaces of the semiconductor element crossed over, so that the degree of freedom of lead arrangement and the pin connection can be very much improved. Also, since some of the inner electrodes of the plurality of semiconductor elements are connected to common leads through the bonding wires, thus connecting the inner electrodes on the semiconductor elements together through the common leads, the reliability of the interconnections between the inner electrodes and the semiconductor elements themselves are improved and the inner electrodes on the non-neighboring side edge portions the semiconductor elements can be interconnected, improving the degree of freedom in lead arrangement. Therefore, the lead inductance can be decreased, resulting in reduction in noise. Also, since the leads can be used in common, about ten percent of the pins can be eliminated when two semiconductor elements with 150 pins are used in MCP semiconductor device, for example. Therefore, the layout of the chip and conductors becomes easy, the device becomes small in size and the design of the peripheral circuits becomes easy. Additionally, since a TAB tape can be used to electrically connect the inner electrodes on the neighboring semiconductor elements, the reliability of the interconnections between these inner electrodes and the semiconductor elements themselves are improved.

What is claimed is:

1. A packaged semiconductor device comprising:
    a plurality of semiconductor elements, each element having a first major surface, a second major surface opposed to the first major surface, and a number of inner electrodes disposed on said first major surface;
    a lead frame on which said semiconductor elements are mounted and having a plurality of leads including a cross-over lead, said cross-over lead extending from one side to an opposed side of at least one of the semiconductor elements without electrically contacting the first and second major surfaces of said at least one semiconductor element;
    bonding wires electrically connecting said inner electrodes on said semiconductor elements to said leads of said lead frame; and
    a resin encapsulating said semiconductor elements said bonding wires, and portions of said leads.

2. The packaged semiconductor device as claimed in claim 1 including an electrically insulating material wherein said at least one semiconductor element is attached at its second major surface to said electrically insulating material and said electrically insulating material is attached to said cross-over lead.

3. The packaged semiconductor device as claimed in claim 1 including an electrician insulating material wherein said at least one semiconductor element is attached at its first major surface to said electrically insulating material and said electrically insulating material is attached to said cross-over lead.

4. The packaged semiconductor device as claimed in claim 1 including first and second semiconductor elements and additional bonding wires wherein at least one of said inner electrodes of said first semiconductor element and at least one of said inner electrodes of said second semiconductor element are electrically connected in common to said cross-over lead by said additional bonding wires.

5. A packaged semiconductor device as claimed in claim 1, wherein said lead frame includes a die-pad and another of said plurality of semiconductor elements is mounted on said die-pad.

6. The packaged semiconductor device as claimed in claim 1 including an electrically insulating material wherein said lead frame includes a die-pad and a first of said plurality of semiconductor elements is mounted on said die pad, said first semiconductor element is attached at its second major surface to said electrically insulating material which is attached to said crossover lead, and wherein at least one of said inner electrodes of said first semiconductor element and at least one of said inner electrodes of a second of said semiconductor elements are electrically connected to said cross-over lead by said bonding wires.

7. The packaged semiconductor device as claimed in claim 1 wherein all of said plurality of semiconductor elements are mounted at their respective second major surfaces to said cross-over lead.

8. A packaged semiconductor device as claimed in claim 7, wherein said cross-over lead extends through said semiconductor device and said inner electrodes on said semiconductor elements are electrically connected to said cross-over lead.

9. The packaged semiconductor device as claimed in claim 1 including an electrically insulating material and additional bonding wires wherein said lead frame includes a die-pad and a first of said plurality of semiconductor elements is mounted on said die pad, said first semiconductor element is attached at its first major surface to said electrically insulating material which is attached to said cross-over lead, and wherein at least one of said inner electrodes of said first semiconductor element and at least one of said inner electrodes of a second semiconductor element are electrically connected to said cross-over lead by said additional bonding wires.

10. The packaged semiconductor device as claimed in claim 1 wherein all of said plurality of semiconductor elements are mounted at their respective first major surfaces on said cross-over lead which is common to all of said semiconductor elements.

11. A packaged semiconductor device as claimed in claim 10, wherein said cross-over lead extends through said semiconductor device and said inner electrodes on said semiconductor elements are electrically connected to said cross-over lead.

12. The packaged semiconductor device as claimed in claim 1 including an insulating material and additional bonding wires wherein said semiconductor elements is attached at its first major surface to said electrically insulating material which is attached to said cross-over lead, a second of said semiconductor elements is attached at its second major surface to said electrically insulating material which is attached to said cross-over lead, and at least one of said inner electrodes of said first semiconductor element and at least one of said inner electrodes of said second semiconductor element are electrically connected in common by said cross-over lead by said additional bonding wires.

13. A packaged semiconductor device comprising:
    a plurality of semiconductor elements, each element having a first major surface, a second major surface opposed to the first major surface, and a number of inner electrodes disposed on said first major surface;
    a lead frame on which said semiconductor elements are mounted and having a plurality of leads including a cross-over lead, said cross-over lead extending from one side to an opposed side of at least one of the semiconductor elements without electrically contacting the first and second major surfaces of said at least one semiconductor element;
    bonding wires electrically connecting at least one of said inner electrodes on only one of said semiconductor elements to said cross-over lead; and a resin encapsulating said semiconductor elements, said bonding wires, and portions of said leads.

14. A packaged semiconductor device as claimed in claim 1 where said cross-over lead is electrically isolated from said inner electrodes of said at least one of the semiconductor elements across which said cross-over lead extends.

* * * * *

UNITED STATES PATENT AND TRADEMARK OFFICE
CERTIFICATE OF CORRECTION

PATENT NO. : 5,373,188
DATED : December 13, 1994
INVENTOR(S) : Michii et al.

It is certified that error appears in the above-indentified patent and that said Letters Patent is hereby corrected as shown below: Title page, Item [56] References Cited, insert --Nikkei Micro Devices (Dec. 1989)--;

Column 7, Line 38, insert "," after elements;

Line 47, change "electrician" to --electrically--;

Line 62, change "another" to --one--;

Column 8, Line 41, between "an" and "insulating" insert --electrically--.

Signed and Sealed this

Eighteenth Day of April, 1995

Attest:

BRUCE LEHMAN

Attesting Officer

Commissioner of Patents and Trademarks